DISPENSING AND TRANSFER MECHANISM FOR ELECTRICAL CIRCUIT BOARDS

Filed June 7, 1957 4 Sheets-Sheet 1

Inventors
Paul A. Maximoff
Stanley J. Krol
By Byron, Hume, Groen & Clement
Attorneys Inventors
Paul A. Maximoff
Stanley J. Krol
By Byron, Hume, Groen & Clement
Attorneys Inventors
Paul A. Maximoff
Stanley J. Krol
By Byron, Hume, Groen & Clement
attorneys Inventors
Paul A. Maximoff
Stanley J. Krol
By Byron, Hume, Groen & Clement
Attorneys United States Patent Office 3,002,654
Patented Oct. 3, 1961

3,002,654

DISPENSING AND TRANSFER MECHANISM FOR ELECTRICAL CIRCUIT BOARDS

Paul A. Maximoff, West Chicago, and Stanley J. Krol, Bensenville, Ill., assignors to Malco Manufacturing Company, Chicago, Ill., a partnership Filed June 7, 1957, Ser. No. 664,404
10 Claims. (Cl. 221—225)

This invention relates to automation of assembling machinery. More particularly, the invention relates to improved dispensing and transfer mechanism for printed electrical circuit boards.

The mechanism of this invention is intended for automatically dispensing and handling printed circuit boards in a machine for automatically dispensing terminal pins in preselected patterns in the boards. A machine of this type is described in the copending application of Paul A. Maximoff, entitled "Apparatus for Dispensing and Mounting Terminal Pins," Serial No. 525,144, filed July 29, 1955, now Patent No. 2,814,802, dated December 3, 1957, and owned by the same assignee as the instant application.

Accordingly, it is an object of the present invention to provide mechanism for automatically dispensing and transferring printed circuit boards between the various operative positions in a terminal pin inserting machine.

Another object of the invention is to provide improved mechanism for handling and automatically feeding printed circuit boards, one at a time, in a terminal pin inserting machine.

A further object of the invention is to provide improved means for storing and dispensing printed circuit boards in an automatic terminal pin inserter machine.

An additional object of the invention is to provide improved means for transferring printed circuit boards between operative stations in an automatic terminal pin inserter machine.

Other objects, features and advantages will be apparent from the following detailed description taken in conjunction with the accompanying drawings, in which.

The mechanism of this invention provides complete automation in the handling of printed circuit boards in a machine for automatically dispensing terminal pins into apertures in the boards. The board handling mechanism includes two major assemblies working in timed sequence for dispensing boards and for transferring the boards through the operative stations of a pin inserter machine.

Figure 1:
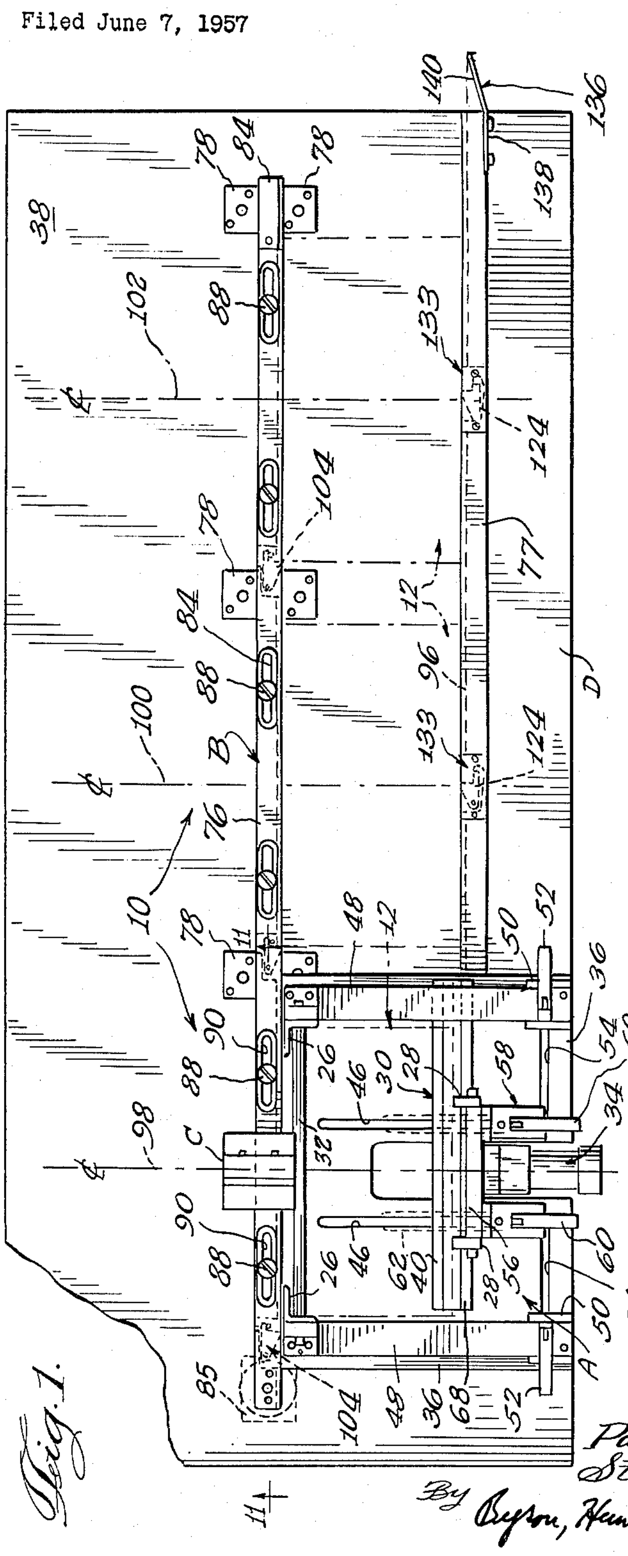
FIGURE 1 is a top elevational view of the dispensing and transfer mechanism according to the present invention.

Referring to FIGURE 1 of the drawings, the board handling mechanism is generally designated by the reference numeral 10. Its two major assemblies, which operate in timed sequence, are a printed circuit board dispensing or "hopper" assembly A and a board transfer mechanism B. Timed sequence of operation of the two major assemblies is accomplished through control apparatus C (only the board control micro-switch being shown) of any suitable construction. The control apparatus enters into the present invention only insofar as it controls and coordinates the sequence of the two major assemblies. The assemblies are mounted on a stationary machine frame D (only portions being shown).

Figure 8:
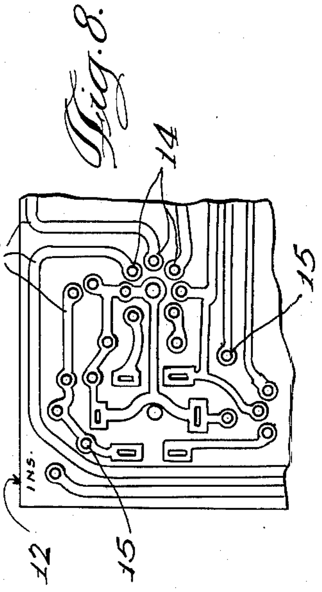
FIGURE 8 is a fragmentary plan view of a typical printed circuit board to be utilized with the mechanism of the present invention.

FIGURE 8 of the drawings illustrates a portion of a printed circuit base board 12 which may be used with apparatus incorporating the present invention. The board 12 has a pattern of electrically conductive material 13 on one surface thereof and a plurality of holes for mounting electrical elements in electrical contact with the conductive material 13. For example, holes 14 are provided for mounting an electronic tube and holes 15 may be used for mounting terminal pins to which may be fastened wiring leads (not shown).

Figure 9:
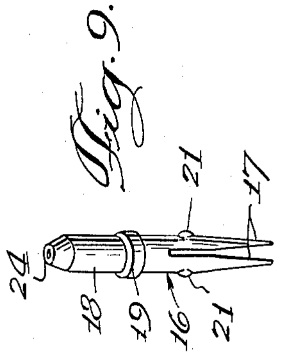
FIGURE 9 is a perspective view of a typical electrical terminal pin to be inserted by a pin inserter machine embodying mechanism of the invention.

One form the terminal pins may take is shown in FIGURE 9. The pin 16 has a tapered nose 17 and a body 18 and may be mounted in the holes 15 of the base board so that the body 18 projects upwardly therefrom. The terminal pin preferably has a longitudinal bore 24 for receiving and attaching a wiring lead, and a bead 19 and bosses 21 may be additionally provided to aid in properly seating the pin in the board. The particular terminal pin illustrated is described in detail in a patent application of Ronald S. Narozny, entitled "Terminal Pin," Serial No. 499,615, filed April 6, 1955, now Patent No. 2,877,441, and owned by the same assignee as the instant application.

*Printed circuit board dispensing assembly*

The board dispensing or "hopper" assembly A is illustrated in FIGURES 1, 2, 3 and 10. The assembly includes a pair of generally upright rearward board guide columns 26, a pair of generally upright forward board guide columns 28, a shiftable board feed or shuttle bar 30, a stationary board receiving or support bar 32, and a double-throw pneumatic actuating cylinder 34. The various elements are supported on a gib plate 36 which, in turn, is fixedly mounted on a base plate 38 which forms a part of the machine frame D.

The printed circuit boards 12 are stacked between the columns 26 and 28 as shown. The rear columns 26 have angular cross sections, and the rear corners of the boards are confined by the respective legs. The forward columns 28 hold the boards in proper fore-and-aft position in conjunction with the rear columns. A large number of printed circuit boards can be stacked in the hopper assembly, limited only by the height of the columns 26 and 28. A weight (not shown) of any suitable type may be placed on top of the stack of boards to insure that they feed properly.

The bottom board in the stack has its rearward edge portion resting on the support bar 32 and its forward edge portion resting on a ledge 40 of the shuttle bar 30, the ledge being the same height as the support bar. A piston (not shown) in the actuating cylinder 34 has a rod 42 connected thereto and connected to the shuttle bar 30. The shuttle bar is provided on its underside with a pair of guide blocks 44 which ride in fore-and-aft grooves 46 formed in the gib plate 36. The actuating cylinder 34 is actuated in timed sequence through the control apparatus C to shift the shuttle bar 30 fore-and-aft.

The rearward board guide columns 26 are fixedly secured to the rearward ends of a pair of support bars 48. The forward ends of the support bars 48 are fixedly secured to a pair of adjustment blocks 50. In turn, the adjustment blocks are manually adjustably secured to the gib plate 36 through manual clamp mechanisms 52 which have portions (not shown) slidably disposed in transverse undercut slideways 54. The support bars 48 are movable side-to-side to adjust the columns 26 toward or away from one another to accommodate boards of different lengths. The bottom edge portions of the rearward columns 26 are slightly more than one board thickness above the top face of the support bar 32 so that one board at a time, and only one, can be slipped rearwardly under the columns.

The forward board support columns 28 are fixedly secured to and supported solely by a plate 56 which, in turn, is fixedly secured to and supported solely by a pair of adjustment blocks 58. The adjustment blocks 58 are adjustably slidably secured to the gib plate 36 by means of manual latch mechanisms 60 having portions (not shown) slidably disposed in undercut slideways 62 formed as portions of the grooves 46. The cylinder 34 is also secured to and supported solely by the support plate 56. Thus, the forward columns 28, the support plate 56, the cylinder 34, and the shuttle bar 30, may all be adjusted fore-and-aft simultaneously through the adjustment blocks 58 to accommodate different widths of printed circuit boards.

The shuttle bar 30 is provided with a longitudinally extending step 64 forward of the ledge 40 and defining a pusher shoulder 66 therebetween. The height of the shoulder 66 is slightly less than the thickness of a single printed circuit board so that as the shuttle bar 30 is shifted rearwardly by the actuating cylinder 34, one, and only one, board is engaged and pushed rearwardly by the shoulder 66 until it engages the transfer assembly B in a manner to be described. The bottom edge portions of the rearward columns 26 allow the bottom board to be pushed rearwardly and prevent the next board from movement.

At its forward edge portion the shuttle bar 30 is provided with a longitudinal rib 68 to which the piston shaft 42 is secured. Portions of the forward columns 28 are cut out at 70 to accommodate fore-and-aft shifting of the shuttle bar.

Figure 10:
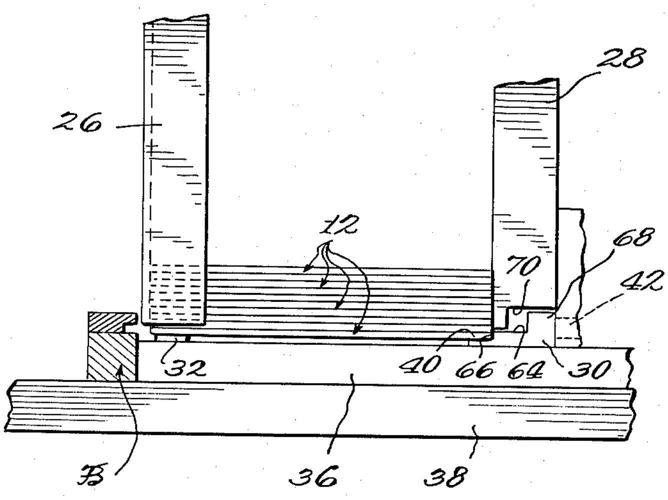
FIGURE 10 is an enlarged fragmentary side elevational view similar to FIGURE 3 but with the board dispensing portion shown in its unactuated position and with some parts eliminated for clarity.
Figure 11:
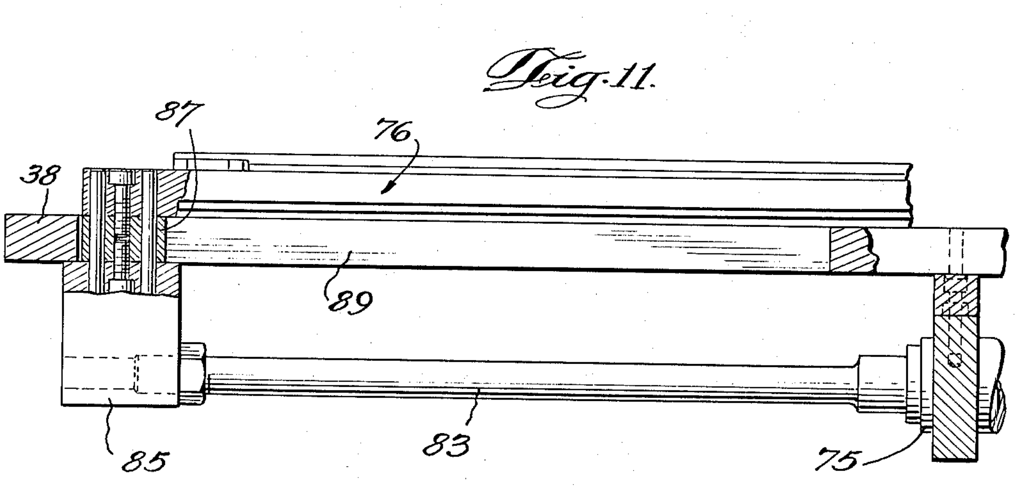
FIGURE 11 is an enlarged fragmentary sectional view taken along line 11—11 of FIGURE 1.

The shuttle bar 30 is shown in solid lines in its rearward, actuated position after having moved the bottom printed circuit board of the stack into engagement with the transfer assembly B. As the shuttle bar is withdrawn to its forward, unactuated position as shown in FIGURE 10, the next-to-bottom printed circuit board is prevented from being frictionally carried forwardly by feet 72 formed at the bottom end portions of the forward columns 28. The feet 72 end only slightly above the step 64 with the clearance between the feet and the step being less than the thickness of one printed circuit board. As each board moves in sequence against the transfer assembly B, it engages an actuator finger (not shown) of a micro-switch assembly 74 (forming a portion of the control apparatus C) which energizes a board presence indicator and other automatic control devices (not shown) in the control apparatus. Automatic operation of the machine is interrupted when the micro-switch assembly 74 senses the absence of a printed circuit board at the proper interval in the sequence.

The arrangement is quite similar to the printed circuit board dispensing assembly of the co-pending patent application of Paul A. Maximoff, Stanley J. Krol and John B. Sola, entitled "Lug Inserter," Serial No. 664,240, filed June 7, 1957, and assigned to the assignee of the present invention.

*Printed circuit board transfer assembly*

The board transfer assembly B is best illustrated in FIGURES 1, 4, 5, 6, 7 and 11. The assembly includes generally a shiftable transfer shaft 76 connected at its left end (FIGURES 1 and 11) to the piston (not shown) of a double-acting penumatic cylinder 75, and a stationary guide bar 77.

The transfer shaft 76 is longitudinally shiftably mounted on the base plate 38 by means of three spaced pairs of gib blocks 78. The gib blocks are fixedly secured to the base plate 38 on opposite sides of the transfer shaft in three longitudinaly spaced positions. Opposed tongues 80 formed on the respective pairs of gib blocks are engaged in oppositely formed longitudinal grooves 82 formed along the lower longitudinal side edges of a longitudinal transfer bar portion 84 which forms the body of the transfer shaft.

The actuating cylinder 75 (FIGURE 11) is fixedly secured below the base plate 38 and has a piston rod 83 connected to its piston (not shown) at one end and to a shiftable connector block 85 at its other end, in a manner quite similar to the transfer cylinder arrangement in the copending patent application of Paul A. Maximoff, Stanley J. Krol and John B. Sola, Serial No. 664,240, referred to previously. The connector block 85 is fixedly secured to the end portion of the transfer shaft 76 through an intermediate guide block 87 which is slidably disposed in a guide groove 89 formed in the base plate 38 below the transfer shaft.

The upper portion of the transfer shaft 76 comprises a longitudinal top rail 86 which is adjustably secured to the transfer bar 84 by means of six button head screws 88 which are threadedly secured to the top of the transfer bar and have their shanks riding in corresponding longitudinal slots 90 formed in the top rail. A counterbore 92 is formed about the upper margin of each of the slots 90 to mate with the heads of the button head screws.

An undercut, longitudinal groove 94 is formed along the forward edge of the top rail 86, and the groove, together with the adjacent upper edge portion of the transfer bar 84, forms a trackway to slidably retain the rearward edge portions of printed circuit boards.

The board guide bar 77 is adjustably fixedly secured to the base plate 38 forwardly of and parallel to the transfer shaft 76. The guide bar is formed with a longitudinal groove 96 which is opposed to and the same height as the groove 94 in the transfer shaft 76. The groove 96 forms a trackway for slidably retaining the forward edge portions of printed circuit boards. Any suitable means (not shown) may be utilized for adjusting the position of the guide bar 77 relative to the transfer shaft 76 in order to accommodate boards of different widths. For example, the guide bar may be adjustably mounted like the board guide rail disclosed in the copending application Serial No. 664,240 referred to above.

Figures 2, 3:
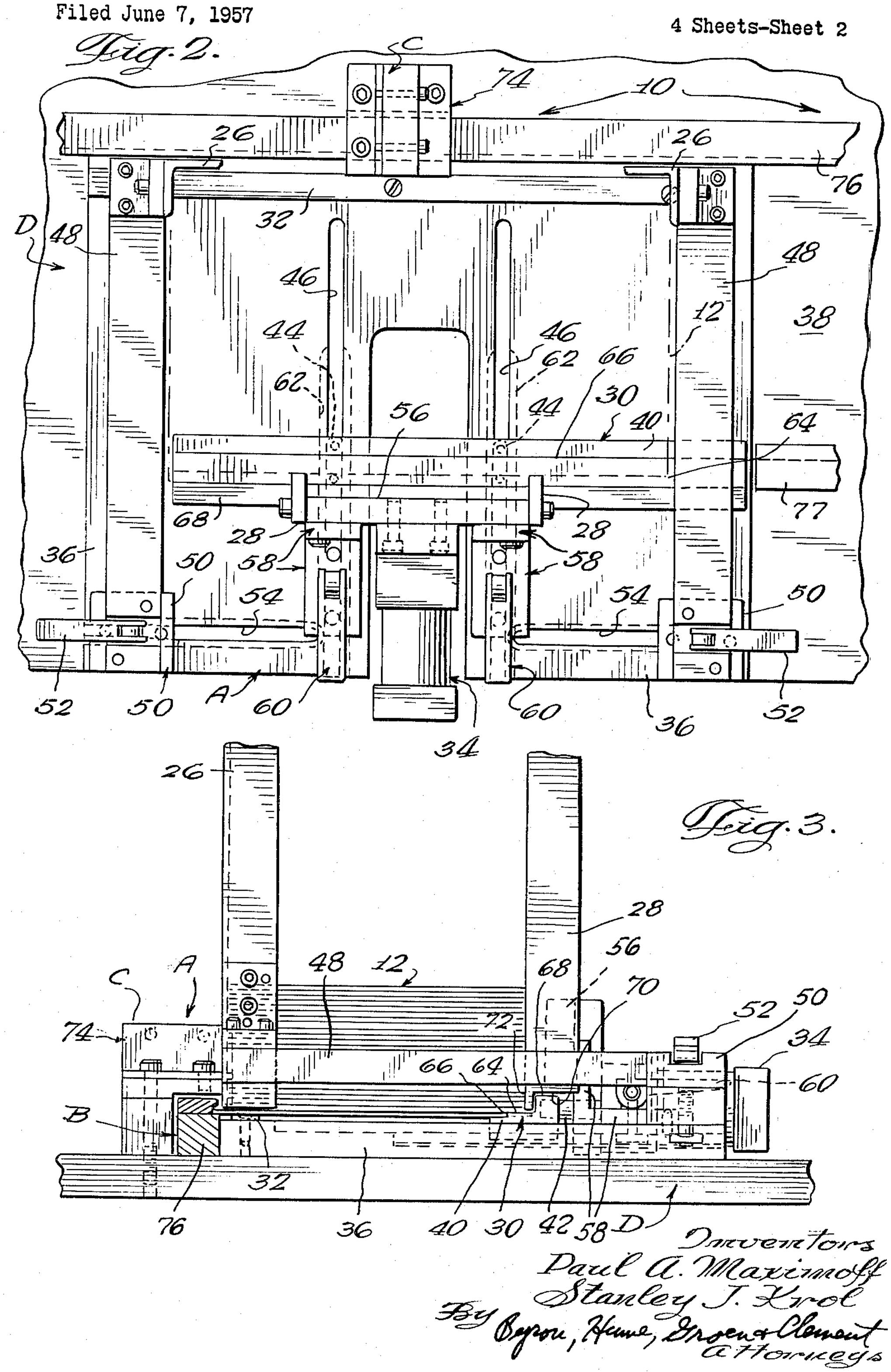
FIGURE 2 is an enlarged fragmentary top elevational view of the printed circuit board dispensing portion of the mechanism.
FIGURE 3 is an enlarged fragmentary side elevational view of the board dispensing portion shown in FIGURE 2.

The bottom surfaces of the grooves 94 and 96 are the same height as the ledge 40 of the shuttle bar 30, and the shoulder 66 of the shuttle bar is aligned with the vertical surface of the forward groove 96 when the shuttle bar is in its rearward, actuated position as seen in FIGURE 3.

The transfer mechanism B is intended for transferring printed circuit boards, one at a time, between various stations of a terminal pin inserter machine such as that shown and described in the application of Paul A. Maximoff, Serial No. 525,144, now Patent No. 2,814,802, referred to hereinabove. The transfer mechanism is adapted to successively transfer printed circuit boards between three different stations. The first station is the hopper station having a center line 98. The second station may be a terminal pin loading or inserting station having a center line 100, and a third station, defined by a center line 102, may be one where any desired subsequent operation can be performed, such as fixedly securing or staking the terminal pins in the printed circuit boards. The center lines 98 and 102 are equally spaced from the center line 100.

Figure 4:
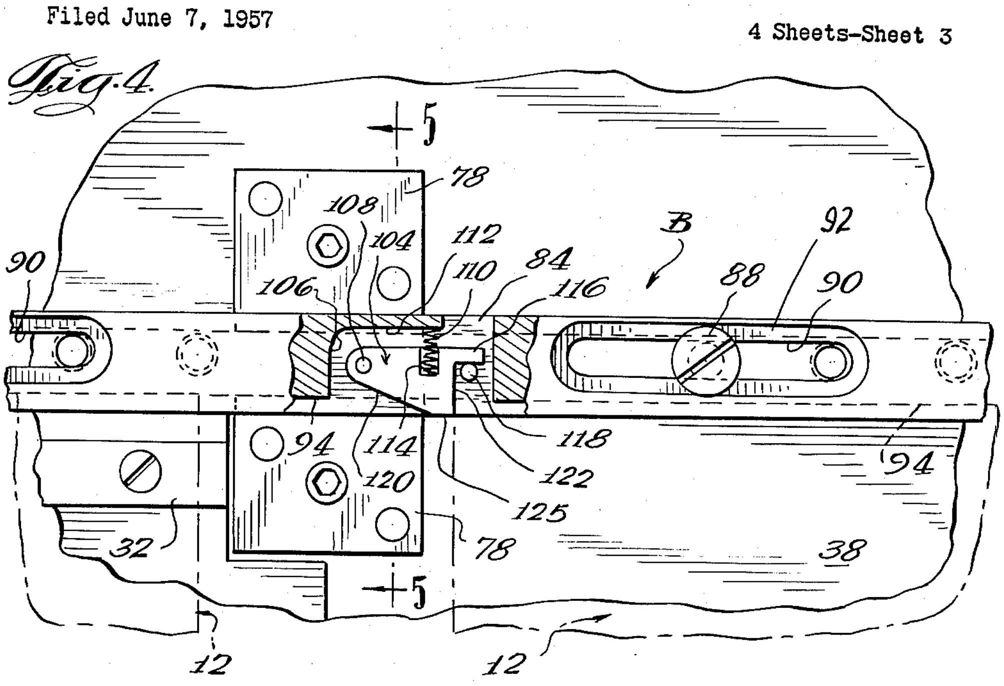
FIGURE 4 is an enlarged fragmentary elevational view of a section of the transfer portion of the mechanism.
Figure 5:
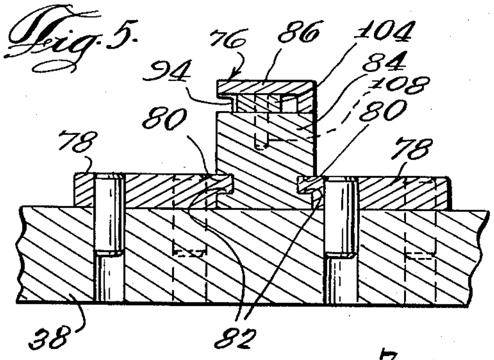
FIGURE 5 is a sectional view taken along line 5—5 of FIGURE 4.
Figure 7:
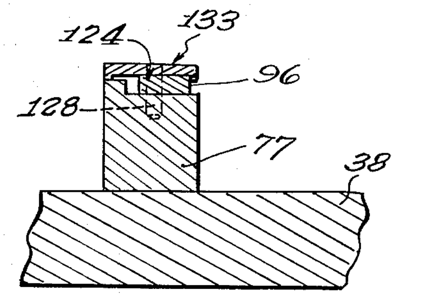
FIGURE 7 is a fragmentary sectional view taken along line 7—7 of FIGURE 6.
Figure 6:
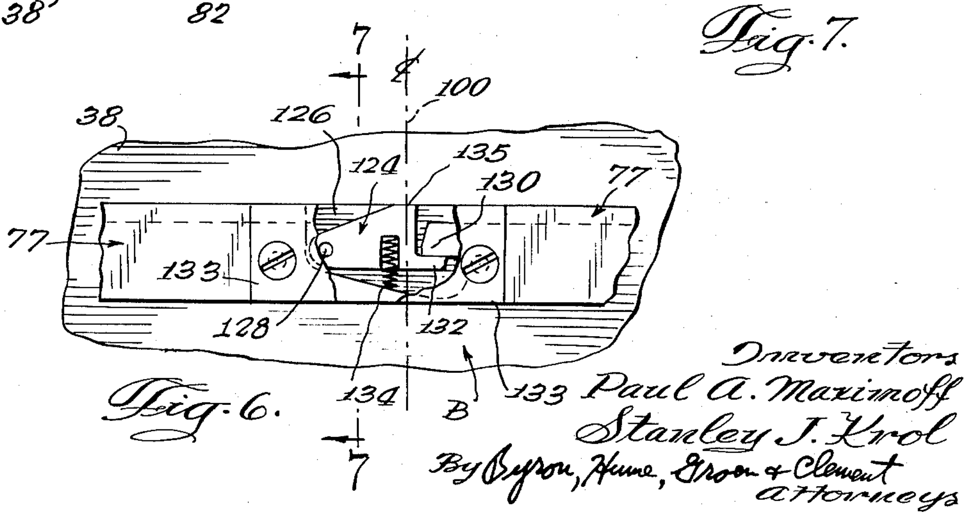
FIGURE 6 is an enlarged fragmentary elevational view of another portion of the transfer portion of the mechanism.

In order to successively transfer printed circuit boards between the three stations shown, the transfer shaft 76 is provided with three pusher fingers or pawls 104, best seen in FIGURES 4 and 5. The fingers 104 are disposed in three underside cut-out areas 106 formed in the top rail at longitudinally spaced positions as shown. The fingers are generally right-triangular in planform and are pivotally connected adjacent one acute angle apex to the top rail 86, by means of pivot pins 108. A compression spring 110 acts between a lip of the top rail, defining a portion of the back edge of the cut-out 106, and the bottom of a notch 114 in each finger 104, tending to resiliently pivot the fingers in a clockwise direction as seen in FIGURES 1 and 4. A stop lug 116 is formed on each finger adjacent its right angle apex and resiliently engages a stop pin 118 secured to the rail. When the stop lugs 116 are in engagement with the corresponding stop pins 118, the hypotenuses 120 of the fingers provide camming edges and the transverse legs 122 provide board engaging edges. The edges 120 and 122 of each finger meet at a flattened forward apex 125 which is generally parallel to the forward surface of the transfer shaft when the stop lug 116 engages the stop pin 118. The fingers 104 are spaced so that the pushing edges 122 are spaced exactly the same as the distance between the center lines 98, 100 and 102.

When the transfer assembly B is set for operation with any particular size of printed circuit board, the top rail 86 is initially positioned with the board engagement edges 122 of the pusher fingers spaced to the left of the respective station center lines exactly half the length of the printed circuit board. As a result, when the successive boards are in engagement with the board engagement edges, as illustrated in phantom lines in FIGURE 1, the respective boards are centered in the stations. The throw of the actuating cylinder is adjusted so that it is exactly equal to the distance between successive stations. When the transfer shaft is actuated in the feed direction (toward the right), the three boards centered at the three stations are moved simultaneously by means of the pusher fingers until each board moves the distance between the successive stations.

The guide bar 77 is provided with a pair of longitudinally spaced, frictional stop fingers 124, identical in configuration to the pusher fingers 104. The stop fingers 124 are pivotally secured to the guide bar in respective, longitudinally spaced recesses 126 by means of pivot pins 128. The recesses 126 are formed with stop abutments 130 which coact with stop lugs 132 formed on the stop fingers, to normally position the stop lugs as shown, under the influence of compression springs 134. Cover plates 133 are fixedly secured to the guide bar covering the recesses and the stop fingers contained therein. A flat apex 135 connecting the hypotenuse and the transversely extending leg of each finger is normally generally parallel with the rearward face of the guide bar. The flat apexes of the respective stop fingers are located on the center lines 100 and 102.

When printed circuit boards are moved by the transfer shaft 76 into the loading and staking stations, the leading edges of the boards depress the stop pawls 124 to permit the boards to continue their movement. When the transfer shaft reaches the end of its feed movement, the printed circuit boards at the loading and staking stations are prevented from overtravelling because of the frictional engagement of the stop fingers 124 with the central forward edges of the boards.

Printed circuit boards which have passed through the three stations of the machine are discharged at the right. As the boards are discharged, there is a tendency for the forward ends to move away from the transfer shaft 76, or in other words there is a tendency for the boards to "skew" forwardly with respect to the machine. To prevent this tendency an anti-skew spring 136 is secured at the right end of the guide bar 77. The spring 136 may be formed of flat spring steel having one leg 138 secured against the forward surface of the guide bar and another leg 140 extending beyond the end of the guide bar and bent rearwardly. To the right end of the spring is normally slightly rearward of the groove 96. When a board is moved to the discharge position, it engages the end portion of the anti-skew spring 136, and the spring causes the board to maintain a straight course until it drops by its own weight.

*Operation*

The board dispensing assembly A and the transfer assembly B are actuated in sequence through the control apparatus C. First, the shuttle bar 30 of the hopper assembly moves rearwardly to feed the bottom board of the stack to the trackway 94 of the transfer shaft 76. Then the transfer shaft is actuated, and the first pusher finger engages the left rear corner of the board and moves it to the right until it is centered at the loading station. Overtravel of the board is prevented by the frictional stop finger 124. Next the transfer shaft moves back to its initial position, and the next board in the hopper assembly is fed by the shuttle bar 30 into engagement with the transfer shaft. The transfer shaft is again actuated in the feed direction, this time moving the first board from the loading station to the staking station and the next board from the hopper station to the loading station. Again, the transfer bar moves back to its initial position and another board is fed by the hopper assembly to the transfer shaft. Subsequent actuation of the transfer shaft now moves three boards, and this sequence of operation continues until the machine is stopped or until all of the boards in the hopper assembly are used.

It will be understood that as the boards remain in the loading and staking stations, during the time required for return of the transfer shaft and for feeding of another board by the hopper assembly, the terminal pin feeding and staking operations can be performed under control of the control apparatus C.

When the mechanism of this invention is to be utilized with boards of different size from the previous run, the hopper assembly A and the transfer assembly B are readily adjusted to accommodate the different lengths and widths of the new boards, as previously described.

Variations and modifications may be effected without departing from the scope of the novel concepts of the present invention.

We claim:

1. In a machine for dispensing and mounting a plurality of pins or the like in base members, mechanism for dispensing and successively transferring the base members one at a time between a plurality of operative positions on the machine, comprising generally vertical columns maintaining a plurality of base members in a stack, dispensing means for moving successive bottom base members out of line of the stack in one direction a distance less than the width of said base members in said direction, and reciprocable transfer means adapted for engaging one edge portion of the successive bottom base members when moved out of line of said stack and for successively shifting the base members in a direction at right angles to said one direction, said dispensing means supporting successive bottom base members which in turn support the stack until the bottom base members are shifted clear of the stack by said transfer means.

2. In a machine for dispensing and mounting a plurality of pins or the like in base members, mechanism for dispensing and successively transferring the base members one at a time between a plurality of operative positions on the machine, comprising a plurality of generally vertical columns maintaining a plurality of base members in a stack, means supporting one edge portion of the bottom base member in the stack below the bottom ends of the columns adjacent said edge portion with the next base member in the stack engaging said adjacent columns, dispensing means for supporting the opposite edge portions of bottom base members and for moving the successive bottom base members out of line of the stack under the bottom ends of said adjacent columns in one direction a distance less than the width of said base members in said direction, a reciprocable transfer shaft having means for supporting said one edge portion of the successive base members, guide means for shiftably supporting said opposite edge portions of the successive base members after they are shifted clear of the stack, and ratchet means on said transfer shaft engaging said one edge portion of the successive base members when the base members are shifted out of line of the stack for moving the base members in a direction at right angles to said one direction.

3. In a machine for dispensing and mounting a plurality of pins or the like in base members, mechanism for dispensing and successively transferring the base members one at a time between a plurality of equally spaced operative positions on the machine, comprising a plurality of generally vertical columns maintaining a plurality of base members in a stack, two of said columns engaging one side of the stack, means supporting the stack of base members and including a shiftable shuttle bar having a portion engaging the side edge of the bottom base member adjacent said two columns, a reciprocable transfer shaft having means for supporting the opposite edge portions of the successive base members, guide means for shiftably supporting said one edge portion of the successive base members, a plurality of spring-pressed pawls secured to said transfer shaft in equally spaced positions the same distance apart as the operative positions on the machine, means for simultaneously longitudinally adjusting the positions of said pawls on said transfer bar whereby said pawls are normally located one-half the length of one base member from the centers of the respective operative positions on the machine, and means for successively alternately operating said shuttle bar and said transfer shaft whereby the successive bottom base members are shifted out of line of said stack and between the operative positions on the machine.

4. In a machine for dispensing and mounting a plurality of pins or the like in base members, mechanism for storing and dispensing base members comprising generally vertical columns maintaining a plurality of base members in a stack, means supporting the base members, means for dispensing successive bottom base members in the stack, and attachment structure carrying said dispensing means and at least one of said columns, said attachment structure being adjustably disposed relative to the others of said columns for simultaneous adjustment to accommodate different widths of base members in said mechanism.

5. In a machine for dispensing and mounting a plurality of pins or the like in base members, mechanism for storing and dispensing base members comprising a plurality of generally vertical columns maintaining a plurality of base members in a stack, means supporting one edge portion of the bottom base member in the stack below the bottom ends of two of said columns adjacent said edge portion with the next base member in the stack engaging said two columns, shuttle means for moving the successive bottom base members out from under the stack under the bottom ends of said two columns, and attachment structure carrying said shuttle means and another of said columns, said attachment structure being adjustably disposed relative to said two columns for simultaneous adjustment to accommodate different widths of base members in said mechanism.

6. In a machine for dispensing and mounting a plurality of pins or the like in base members, mechaninsm for storing and dispensing base member comprising a plurality of generally vertical columns maintaining a plurality of base members in a stack, two of said columns engaging one side of the stack, means supporting the stack of base members and including a shiftable shuttle bar having a portion engaging the side edge of the bottom base member adjacent said two columns, power mechanism connected for shifting said shuttle bar, and adjustable position support structure supporting said two columns and said power mechanism whereby the two columns and the power mechanism with the connected shuttle bar may be shifted as a unit with respect to the remainder of said plurality of columns to accommodate base members of different sizes.

7. In a machine for dispensing and mounting a plurality of pins or the like in base members, mechanism for successively transferring the base members one at a time between a plurality of operative positions on the machine, comprising a reciprocable transfer shaft having means for supporting one edge portion of each base member, guide means shiftably supporting the opposite edge portion of each base member, and ratchet means on said transfer shaft engaging the base members only when the shaft is moved in one direction to successively move base members between the operative positions on the machine as the transfer shaft is reciprocated.

8. In a machine for dispensing and mounting a plurality of pins or the like in base members, mechanism for successively transferring the base members one at a time between a plurality of operative positions on the machine, comprising a reciprocable transfer shaft having means for supporting one edge portion of each base member, guide means shiftably supporting the opposite edge portion of each base member, means on said transfer shaft for moving base members successively in one direction only between the operative positions on the machine as the transfer shaft is reciprocated, means preventing movement of said base members opposite to said one direction, and a frictional brake secured to said guide means at each of the operative positions on the machine except the first operative position, whereby said frictional brakes prevent overtravelling of said base members as said transfer shaft is reciprocated.

9. In a machine for dispensing and mounting a plurality of pins or the like in base members, mechanism for successively transferring the base members one at a time between a plurality of equally spaced operative positions on the machine, comprising a reciprocable transfer shaft including a longitudinal transfer bar and a longitudinal transfer rail disposed on top of said bar, a trackway formed by said bar and said rail for supporting one edge portion of each base member, a plurality of spring-pressed pawls secured to said rail in equally spaced positions the same distance apart as the operative positions on the machine and having portions disposed in said trackway, guide means shiftably supporting the opposite edge of each base member, means for longitudinally adjustably securing said rail to said bar whereby said pawls are normally located one-half the length of one base member from the centers of the respective operative positions on the machine, and whereby reciprocation of said transfer shaft moves base members successively in one direction between the operative positions on the machine and centers the base members at the centers of the successive operative stations, and means preventing movement of said base members opposite to said one direction.

10. In a machine for dispensing and mounting a plurality of pins or the like in base members, mechanism for successively transferring the base members one at a time between a plurality of equally spaced operative positions on the machine, comprising a reciprocable transfer shaft having means for supporting one edge portion of each base member, guide means shiftably supporting the opposite edge of each base member, a plurality of spring-pressed pawls secured to said transfer shaft in equally spaced positions the same distance apart as the operative positions on the machine, said pawls being adapted to engage and shift base members in one direction only when said transfer shaft is shifted in said one direction and being adapted to disengage and pass the base members when the transfer shaft is moved in the other direction, means preventing movement of said base members opposite to said one direction, means for reciprocating the transfer shaft with a stroke equal to the distance between the successive operative positions on the machine whereby base members are moved successively in said one direction between the operative positions on the machine, means for simultaneously longitudinally shifting the positions of said pawls on said transfer shaft so that said pawls are normally located one-half the length of one base member from the centers of the respective operative positions on the machine, and a frictional brake secured to said guide means at each of the operative positions on the machine except the first operative position whereby said frictional brakes prevent overtravelling of said base members as said transfer shaft is reciprocated.

References Cited in the file of this patent

UNITED STATES PATENTS

| | | |
|---|---|---|
| 1,283,522 | Jackson | Nov. 5, 1918 |
| 1,401,687 | Fogde et al. | Dec. 27, 1921 |
| 1,779,683 | Strandt et al. | Oct. 28, 1930 |
| 1,838,780 | Miller et al. | Dec. 29, 1931 |
| 1,985,765 | Cornock | Dec. 25, 1934 |
| 2,138,662 | Neumair | Nov. 29, 1938 |
| 2,207,782 | Carlson | July 16, 1940 |
| 2,385,521 | Mead | Sept. 25, 1945 |
| 2,387,211 | Barnby et al. | Oct. 16, 1945 |
| 2,511,099 | Case | June 13, 1950 |
| 2,523,968 | Paulson | Sept. 26, 1950 |

UNITED STATES PATENT OFFICE

CERTIFICATE OF CORRECTION

Patent No. 3,002,654 October 3, 1961

Paul A. Maximoff et al.

It is hereby certified that error appears in the above numbered patent requiring correction and that the said Letters Patent should read as corrected below.

Column 4, line 13, for "penumatic" read -- pneumatic --; line 19, for "longitudinaly" read -- longitudinally --; column 6, line 11, for "To the" read -- The --; column 8, line 5, for "mechaninsm" read -- mechanism --; line 6, for "member" read -- members --.

Signed and sealed this 3rd day of April 1962.

(SEAL)
Attest:

ERNEST W. SWIDER
Attesting Officer

DAVID L. LADD
Commissioner of Patents